US006198976B1

United States Patent
Sundar et al.

(10) Patent No.: US 6,198,976 B1
(45) Date of Patent: Mar. 6, 2001

(54) ON THE FLY CENTER-FINDING DURING SUBSTRATE HANDLING IN A PROCESSING SYSTEM

(75) Inventors: Satish Sundar, Mountain View; Peter F. Ebbing, Los Altos, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/034,808

(22) Filed: Mar. 4, 1998

(51) Int. Cl.[7] .................................................. G05B 19/18
(52) U.S. Cl. .............................................. 700/59; 700/121
(58) Field of Search ............................. 700/59, 121, 115; 414/935, 936

(56) References Cited

U.S. PATENT DOCUMENTS

| | | |
|---|---|---|
| 4,819,167 | 4/1989 | Cheng et al. . |
| 5,452,521 | 9/1995 | Niewmierzycki ................ 33/520 |
| 5,483,138 | 1/1996 | Shmookler et al. ............ 318/568.16 |
| 5,655,060 | 8/1997 | Lucas . |
| 5,706,201 | 1/1998 | Andrews ........................ 364/468.15 |
| 5,933,351 | * 8/1999 | Balamurugan ..................... 700/121 |
| 5,980,088 | * 11/1999 | Iwasaki et al. ..................... 700/166 |
| 5,980,194 | * 11/1999 | Freerks et al. ..................... 414/754 |

FOREIGN PATENT DOCUMENTS

| | | | |
|---|---|---|---|
| 0 288 233 A2 | 10/1988 | (EP) ............................. H01L/21/00 |
| 0 288 233 A3 | 10/1988 | (EP) ............................. H01L/21/00 |

OTHER PUBLICATIONS

PCT International Search Report dated Jul. 27, 1999.

* cited by examiner

Primary Examiner—William Grant
Assistant Examiner—Zoila Cabrera
(74) Attorney, Agent, or Firm—Thomason, Moser & Patterson (57) ABSTRACT

A substrate center-finding method and apparatus, for determining the center of a substrate being passed through a substrate handling chamber of a substrate processing system, includes any number of sensors arranged in any configuration and permits the substrate to pass through any trajectory that triggers the sensors. The locations of the sensors are calibrated by homing in on the sensors using a point, the reference point, near the tip of an arm assembly on a substrate handler. The substrate handler has an encoder for sensing the pivot angles of links in the arm assembly, whereby the coordinates of the reference point can be calculated from the angles and lengths of the links. When the substrate triggers a sensor, the location of the reference point is again calculated, and the coordinates of the trigger point on the edge of the substrate is determined relative to the reference point. A suitable number of trigger points on the edge of a circular substrate will define a circle, so the center of the circle can be calculated, and the location of the substrate can be adjusted to account for any offset from the reference point.

18 Claims, 5 Drawing Sheets

ON THE FLY CENTER-FINDING DURING SUBSTRATE HANDLING IN A PROCESSING SYSTEM

BACKGROUND OF THE INVENTION

1. Field of the Invention

The present invention generally relates to methods and apparatuses for handling a moving object, such as a substrate, in a processing system. Specifically, the present invention relates to methods and apparatuses for determining the center of a substrate while the substrate is moving through a substrate handling environment of a vacuum processing system.

2. Background of the Related Art

Vacuum processing systems for processing 100 mm, 200 mm, 300 mm or other diameter substrates are generally known. Typically, such vacuum processing systems have a centralized transfer chamber mounted on a monolith platform. The transfer chamber is the center of activity for the movement of substrates being processed in the system. One or more process chambers mount on the transfer chamber at the position of slit valves through which substrates are passed by a substrate handler, or robot, pivotably mounted in the transfer chamber. Access to the transfer chamber from a clean ambient environment is typically through one or more load lock chambers attached at other slit valves. The transfer chamber substrate handler is mounted in the middle of the transfer chamber and can access each of the process chambers and load lock chambers to transfer a substrate therebetween. The load lock chambers may open to a very clean room, referred to as the white area, or to a substrate handling chamber, typically referred to as a mini-environment. The mini-environment transfers substrates in a very clean environment at atmospheric pressure from pods, or cassettes or carriers, seated on pod loaders to the load lock chambers.

The mini-environment has a substrate handler for transferring the substrates. The substrate handler in the mini-environment is typically different from that in the transfer chamber, since it is typically capable of translational and vertical movement as well as rotation and extension; whereas, the substrate handler in the transfer chamber is typically only capable of rotation and extension. Either type of substrate handler has an arm assembly for manipulating the substrates that it transfers. One prevalent type of arm assembly has multiple arms pivotably attached to each other at pivot joints in order to extend and retract a blade, or end effector, which supports the substrate. The position of the arms is typically determined from an encoder that detects the angle of the pivot joints. A controller, such as a microcomputer, receives signals from the encoder and calculates the position of the blade.

A typical processing system includes a substrate center-finding system locates the center of the substrate in order to adjust the location of the substrate, so the substrate is centered on each of the structures which support the substrate in the system to avoid damage to the substrate and to ensure proper processing of the substrate. The center-finding system typically includes a set of emitter/sensor pairs, such as infrared beam emitters and sensors, for detecting the edge of the substrate. The center-finding system is typically disposed in a part of the processing system through which the substrate is passed, such as the transfer chamber or the mini-environment, so that the sensors can detect the edge of the substrate at several locations as the substrate passes through the beams. These substrate center-finding systems that determine the location of the center of a substrate while the substrate is moving are called on-the-fly center-finding systems.

On-the-fly center-finding systems are quite often used to make corrections for substrate misalignment. They typically consist of banks of through-beam or reflective sensors, such as an infrared emitter/sensor pair, arranged in the chamber through which the substrates pass. A typical arrangement for the sensors may have three to nine sensors arranged in one to three sensor banks. A substrate handler passes a substrate through the sensor beams. When the substrate interferes with, or cuts, a beam, the associated sensor is triggered and sends a signal to the controller indicating the trigger. When the controller receives a trigger signal, the controller records the encoder position. Thus, as the substrate is passed through the bank of sensors, information on the substrate position is obtained by recording the substrate handler encoder position every time a sensor triggers by and computing the substrate center from the positions. The accuracy and repeatability of existing methods, however, is dependent on the accuracy of placement and alignment of the sensors, the need to move the robot along straight line or circular paths and a known, constant speed of the substrate. For example, some types of on-the-fly center-finding systems require the substrate to be moved in a straight line through the sensor beams, use two sensors that must be arranged in a line perpendicular to the straight line of the substrate movement, assume the radius of the substrate, and do not work for substrates having substrate flats. Another type of center-finding system requires the substrate to be moved in a circular arc and uses three sensors that must be arranged in a line perpendicular to a tangent of the arc. Some centering-finding systems also require the use of a calibration substrate to calibrate the system, so the performance of the system is also dependent on the characteristics of the calibration substrate.

Figure 1A:
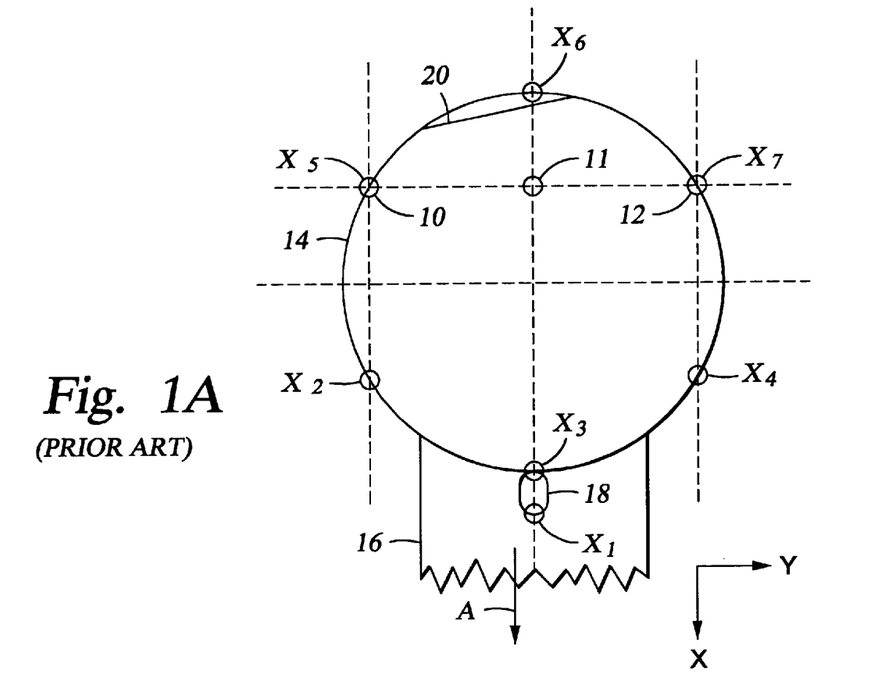
FIG. 1a is a top view of a prior art apparatus for finding the center of a substrate.

FIG. 1a shows an example of a substrate center-finding system such as the one described in U.S. Pat. No. 4,819,167, which is assigned in common with the present application and is incorporated herein by reference. In this center-finding system, a substrate 14, on a blade 16, is passed through an array of sensors 10–12 in a straight-line path in the direction of arrow A to determine the x-y coordinates of points on the edge of the substrate 14, with the x-axis being in the direction of the substrate path. The sensors 10–12 are required to be positioned in a straight line that is perpendicular to the path (arrow A) of the substrate 14 and blade 16. A further requirement is that the blade 16 has a hole 18, which must be aligned with the middle sensor 11. The location of the blade 16 is calibrated by sending a calibration substrate through the center-finding system to find the center of the blade 16. Other prior art center-finding systems may also require the substrate to be moved in a straight line as described in this example, or may require that the substrate be moved in a circular line.

The center-finding system shown in FIG. 1a requires seven coordinate points, one for the blade position, and six for the substrate position. As the substrate 14 and blade 16 pass through the sensors 10–12, the blade 16 triggers the middle sensor 11 when the hole 18 is detected at point $X_1$, thus providing the blade position. For some substrate center-finding systems of this type, the hole 18 may be very difficult to align to the sensor 11 and, thus, hard to detect. As the substrate 14 continues to move, the substrate 14 triggers the middle sensor 11 at the leading edge of the substrate 14, point $X_3$. The substrate 14 triggers the outer sensors 10, 12 to provide the next leading edge positions at points $X_2$ and $X_4$. The substrate 14 next triggers the outer sensors 10, 12 to provide the trailing edge positions at points $X_5$ and $X_7$. Finally, the substrate 14 triggers the middle sensor 11 to provide the last trailing edge position at point $X_6$.

This center-finding system determines the x-coordinates for the points $X_2$–$X_7$ by recording the distance the blade 16 has traveled at each of these points from point $X_1$. The point $X_1$, the blade position, is defined as the origin of the coordinate system, and the x-coordinate for the six substrate points are calculated with reference to the blade position. The average x-coordinate for each pair of substrate points for each sensor is calculated. If the substrate is completely circular, then all three averages should be about the same and should correspond to the x-coordinate for the center of the substrate 14. However, most substrates have a substrate flat 20 or notch in order to indicate the alignment of the substrate. In FIG. 1a, the substrate flat 20 is shown to be in the path of the middle sensor 11, so the substrate 14 will trigger the middle sensor 11 to provide the trailing edge point $X_6$ at the substrate flat 20. The substrate points $X_3$, X6 for this sensor 11 will provide an average x-coordinate that is substantially different from the averages for the other pairs of substrate points, thus identifying the fact that the middle sensor 11 was triggered by the substrate flat 20. The data points $X_3$ and $X_6$ for the sensor 11 can be discarded, and the other four data points $X_2$, $X_4$, $X_5$ and $X_7$ can be defined as valid, or useable, data points. The x-coordinate of the substrate center is determined from the average of the x-coordinates for the valid data points.

The y-coordinates of the sensors are predetermined from a measurement of the distance between the sensors and define the y-coordinates for each of the data points. A calculation for approximating the y-coordinate of the center of the substrate 14, is based on the x-y coordinates of the valid substrate points and the x-coordinate determined above. The correction for the center of the substrate is determined by comparing the calculated actual x-y coordinates of the substrate center with a calibrated x-y center coordinate corresponding to the blade center. Once the x-y coordinates for the center of the substrate 14 are determined, the controller for the substrate handler adjusts the movement of the substrate 14 to center the substrate 14 appropriately in a chamber where it is to be processed.

A problem with this center-finding system is that it has several inflexible requirements. One of the requirements of this system is that the substrate 14 must move in a straight line in the direction of arrow A. If the substrate 14 does not move in a straight line, then the data points $X_1$–$X_7$ will not line up according to the dashed lines shown in FIG. 1a, and none of the calculations will be correct. Another requirement is that the sensors 10–12 must be in a straight line. If any of the sensors 10–12 is not in a straight line with the other two, then the calculation for the average x-coordinate, as measured from point $X_1$, of the pair of data points for that sensor will not be valid. Yet another requirement is that the line of the sensors 10–12 must be perpendicular to the line of the substrate movement (arrow A). If the line of the sensors 10–12 is not perpendicular to the line of the substrate movement, then none of the average x-coordinates for each of the pairs of data points for all of the sensors 10–12 will be the same. Another requirement is that there must be at least three sensors 10–12. If there is less than three sensors, then it will not be possible to discard one pair of data points to account for the substrate flat 20, since the calculations cannot proceed with just one pair of data points. Still another requirement of this center-finding system is that, if the system starts processing a different size substrate, then the distance between the sensors 10–12 may have to be changed. If the processing system starts processing larger substrates, then the sensors may have to be spaced further apart, so the substrate flat cannot cross more than one sensor. On the other hand, if the processing system starts processing smaller substrates, then the sensors may have to be spaced closer together, so the sensors will not miss the substrate. Such repositioning of the sensors 10–12 requires very careful measurements of the new locations of the sensors. Each of these requirements adds to either the complexity of the overall system or its cost or both.

Figure 1B:
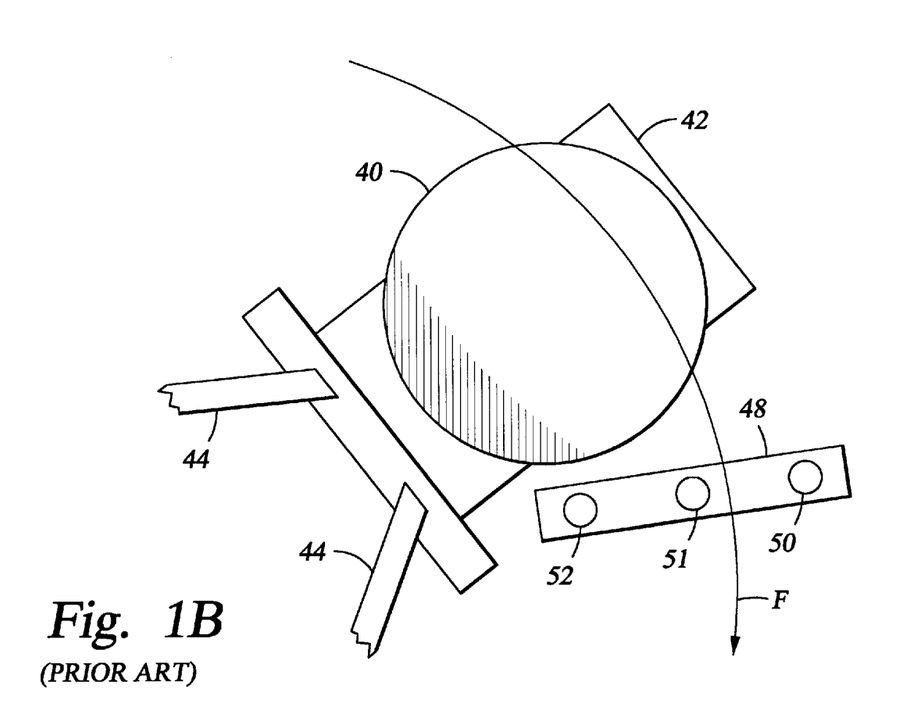
FIG. 1b is a top view of another prior art apparatus for finding the center of a substrate.

FIG. 1b shows an example of another substrate center-finding system that has certain inflexible requirements such as those discussed above. The substrate 40 is supported on a substrate blade 42 of a substrate handler disposed in a chamber, such as a transfer chamber. The blade 42 is operated by two struts 44 attached to a motion actuator of the substrate handler. The substrate handler can move the substrate 40 back and forth inside the transfer chamber in a circular path, represented by arrow F, in order to move the substrate 40 between the various process chambers and load lock chambers attached to the transfer chamber. A bank 48 of sensor units 50–52, for sensing the edges of the substrate 40, is mounted in the transfer chamber in the path of the substrate 40. The substrate 40 triggers the sensor units 50–52 on its leading and trailing edges as it passes through the sensor beams emitted from the sensor units 50–52. In addition to requiring that the substrate 40 be moved in a circular path, center-finding systems of this type have required that the sensor bank 48 include at least three sensor units 50–52, that the sensor units 50–52 be placed in a straight line, and that the straight line of the sensor units 50–52 be radial to the rotational center of the substrate handler. Thus, similar to the center-finding system shown in FIG. 1a, the type of center-finding system shown in FIG. 1b has inflexible requirements that add to either the complexity of the overall system or its cost or both.

Additionally, a problem with some prior art center-finding systems includes the need to have a calibrating substrate for an operator to calibrate the system. The calibrating substrate is known to have a very precise geometry, and the operator places it in the processing system with its centering and alignment known, so that the accuracy of the center-finding system may be determined.

A need, therefore, exists for a substrate center-finding system and method that permits a very flexible operation without strict requirements on the shape of the path of the substrate, the size of the substrate, the positioning of the sensors, the number of sensors, or a calibration substrate.

SUMMARY OF THE INVENTION

A vacuum processing system has a substrate handling chamber with a substrate center-finding system that determines the location of the center of a substrate as the substrate is being passed through the chamber and adjusts the trajectory of the substrate to account for any offset in the center of the substrate. The substrate center is determined relative to the location of a point, referred to herein as the reference point, at or near the tip of a substrate handling arm on a substrate handler. The substrate handler has a number of links, or arms, that are pivotably attached together to form an arm assembly for moving the substrate. The arm assembly has an encoder for sensing the angle of each link with respect to a known coordinate system. The length of each link is known either from measurements taken after construction of the links or due to construction under strict tolerances, so the position of the reference point of the arm assembly can be calculated from the angles and lengths of each link.

The substrate center-finding system has a bank of any number of sensors for triggering as the edge of the substrate passes through the sensor bank. Each sensor is disposed at any location in the expected path of the substrate. Although the substrate center-finding system operates best with an optimum number of and location for the sensors, the path of the substrate through the substrate handling chamber can be adjusted to account for less than optimum numbers or locations. The location of the sensors is calibrated with a suitable homing procedure that aligns the reference point with the sensor and then calculates the coordinates of the sensor from the angles and lengths of the links of the arm assembly using kinematic equations for the arm assembly of the substrate handler.

As a substrate is passed in any trajectory that takes the substrate through the sensors, every time that a sensor triggers on either the leading edge or trailing edge of the substrate, the position of the reference point is calculated from the angles and lengths of the links. With the calibrated positions of the sensors, the coordinates of each of the trigger points on the edge of the substrate are calculated relative to the reference point. Since the substrate is circular, the trigger points define a circle, and the center of that circle can be calculated with a suitable procedure using three or more points on the circle. Then, the center of the substrate is determined relative to the reference point so the substrate can be properly located in the chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2A:
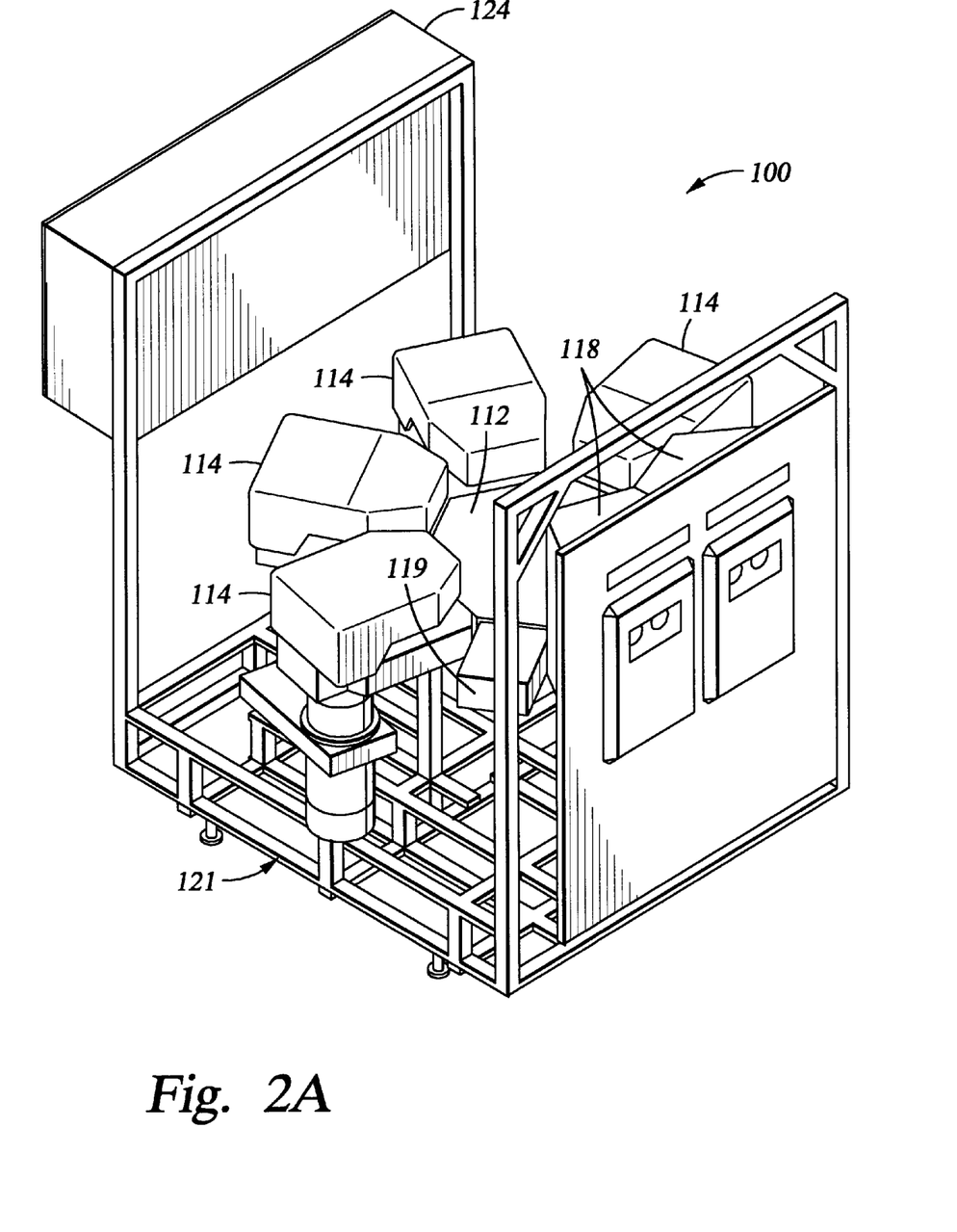
FIG. 2a is a perspective view of a vacuum processing system.
Figure 2B:
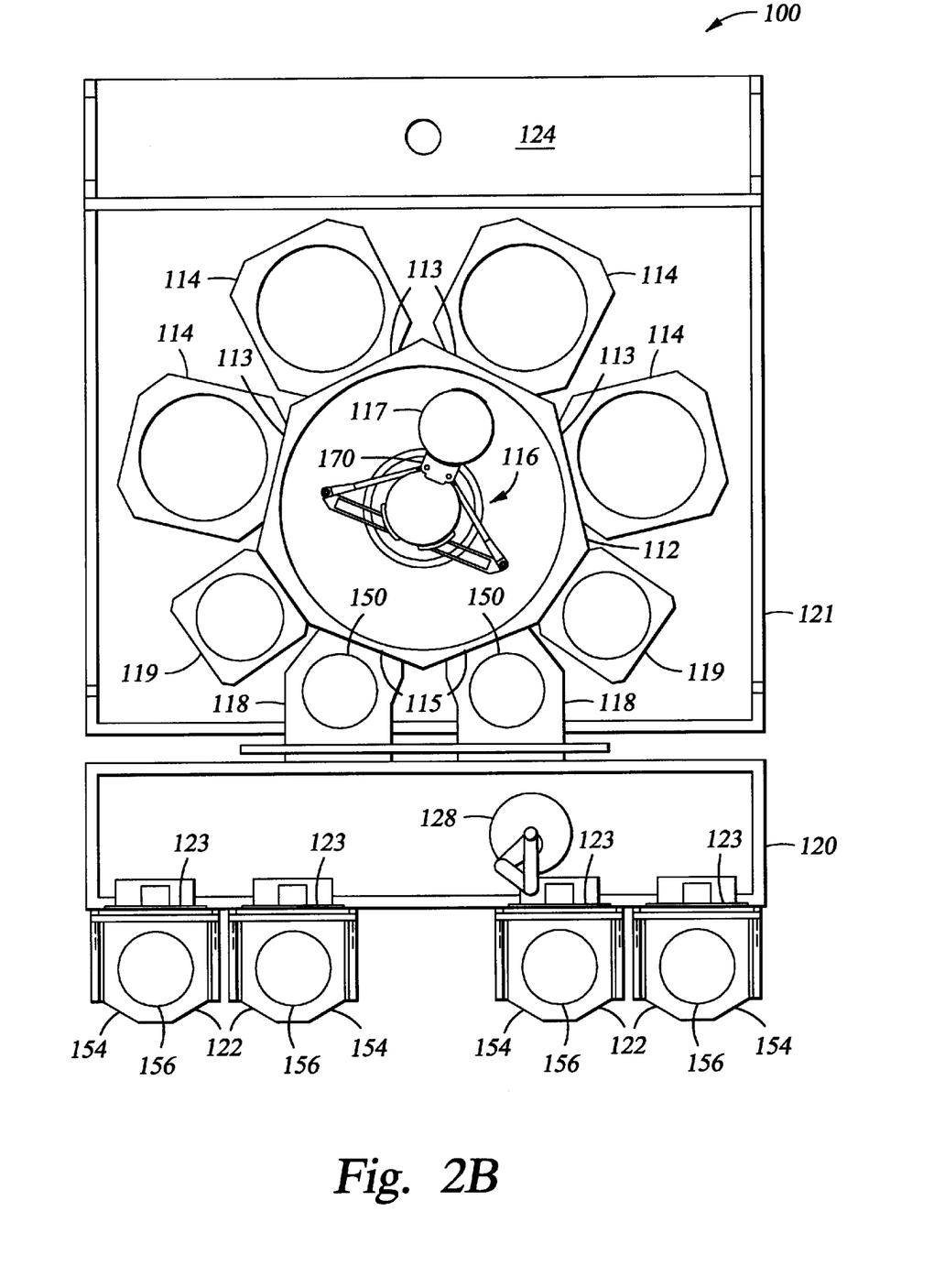
FIG. 2b is a top schematic view of a vacuum processing system.

FIGS. 2a and 2b show two configurations for an embodiment of a vacuum processing system 100 of the present invention. The vacuum processing system 100 and its function will be described in detail below. Generally, the vacuum processing system 100 includes a transfer chamber 112, one or more process chambers 114, one or more load lock chambers 118, one or more expansion or cool-down chambers 119, a platform frame 121, a gas panel 124 and an optional substrate handling chamber 120, referred to herein as the mini-environment. The transfer chamber 112 and the mini-environment 120 both have a substrate handler 116, 128, or robot, for transferring substrates therethrough. Although the center-finding system and method described below will be described in detail with reference to the mini-environment substrate handler 128 and the mini-environment 120, it is understood that the present invention is not limited strictly for use therewith. Rather, the present invention may also be adapted for use with the transfer chamber substrate handler 116 and the transfer chamber 112 or any other type of substrate handler and environment.

The mini-environment substrate handler 128 has an arm assembly and a lift mechanism for transferring substrates 156 from pod loaders 122 to load lock chambers 118. Additionally, the substrate handler 128 is typically track-mounted in order to move between each of the pod loaders 122 and load lock chambers 118. The substrate handler 128 operates under the control of a controller to position the tip of its arm assembly and to send positional feedback to the controller in order to pick up and transfer a substrate. A bank of sensors, described below, is disposed within the mini-environment 120 for detecting the edge of a substrate as the substrate triggers the sensors and for sending trigger signals to the controller. With the procedure described below, the sensors may be located anywhere in the path of the substrate, and the substrate may move through any path between the pod loaders 122 and the load lock chambers 118. Based on the positional feedback from the substrate handler 128 and the trigger signals from the sensors, the controller can determine the location of the center of a substrate while the substrate handler 128 moves the substrate through the mini-environment 120 and can correct the movement of the tip of the arm assembly to account for any offset in the substrate center to accurately position a substrate.

Figure 3:
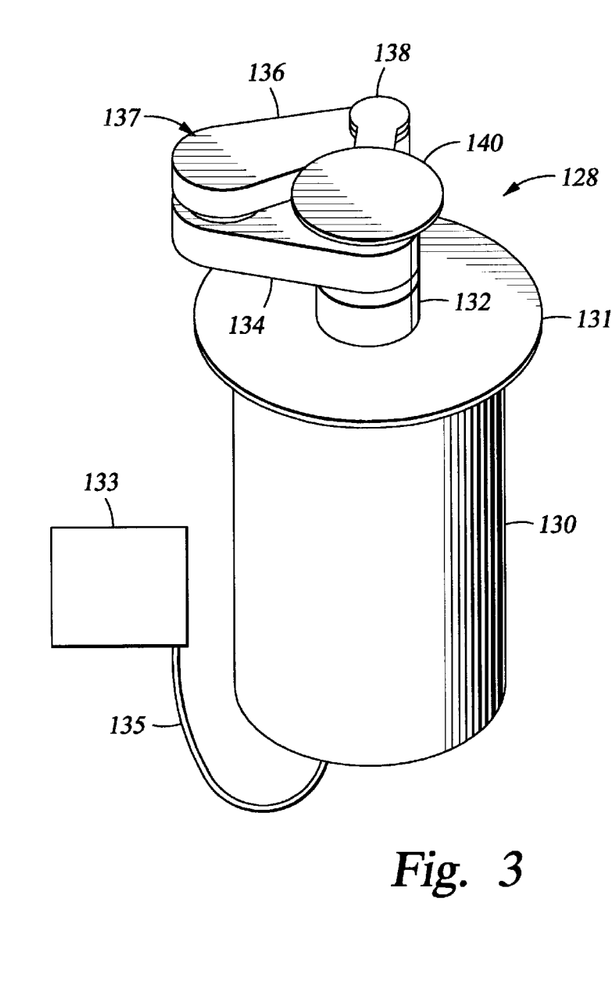
FIG. 3 is a perspective view of a substrate handler.

FIG. 3 shows an embodiment of a mini-environment substrate handler 128. This substrate handler 128 is similar to the ATM-105 Robot available from Equipe Technologies of Sunnyvale, Calif. The substrate handler 128 has a main body portion, or base, 130, a lift cylinder 132, and an arm assembly 137. The main body portion 130 is a housing for a motor assembly for operating the substrate handler 128 and for a controller for controlling the operation of the substrate handler 128 according to instructions received from a system controller 133 through signal wires, or cables, 135. The lift cylinder 132 is disposed partially in the main body portion 130 through the top 131 of the main body portion 130. The motor assembly raises and lowers the lift cylinder 132 out of and into the main body portion 130 in order thereby to raise and lower the arm assembly 137. The arm assembly 137 includes three motion arms. The first arm 134 mounts to the top of the lift cylinder 132 and pivots about an axis substantially coaxial with the lift cylinder 132. The middle arm 136 mounts to the free end of the first arm 134 and pivots thereon. Likewise, the third arm, or end effector, 138 mounts to the free end of the middle arm 136 and pivots thereon. The end effector 138 provides the support for a substrate 140. The motion arms 137 cooperate to move the end effector 138 substantially radially from the axis of the lift cylinder 132 in order to insert the substrate 140 into a pod 154 or a load lock chamber 118 or to remove the substrate 140 therefrom.

Figure 4:
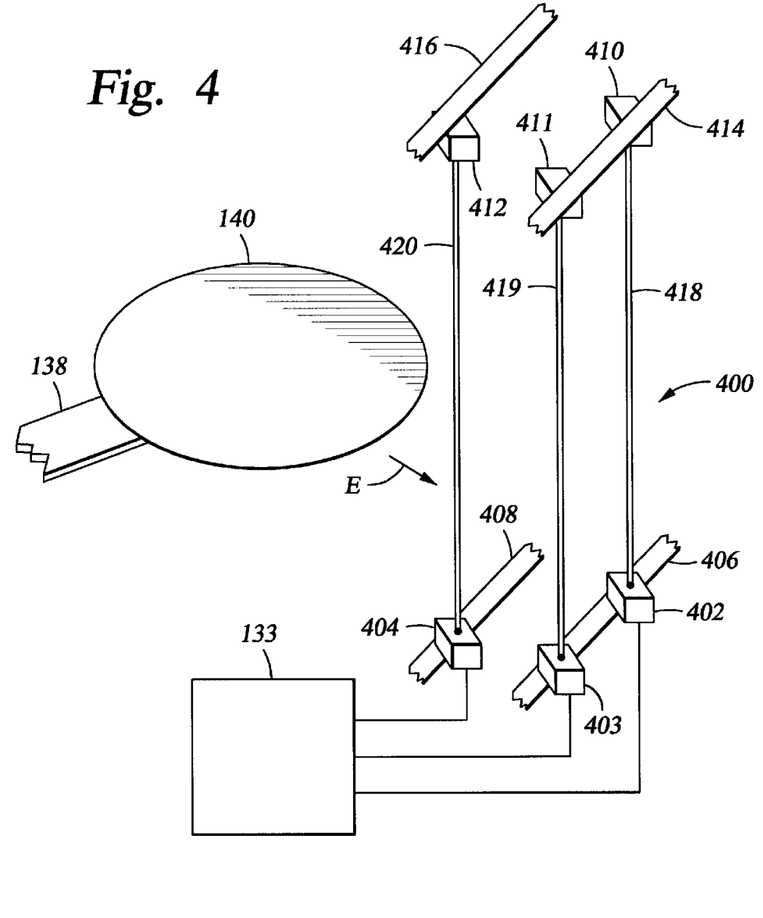
FIG. 4 is a perspective view of a substrate and center-finding system.

FIG. 4 shows the substrate 140 supported on the end effector 138. The substrate 140 may move in any trajectory, but generally in the direction of arrow E toward the center-finding system 400 disposed in the mini-environment 120. The system 400 comprises three optical sensors 402–404 mounted below the trajectory of the substrate 140 on braces 406, 408 and three optical emitters 410–412 mounted above the trajectory of the substrate 140 on braces 414, 416. Each emitter/sensor pair may be any appropriate type of emitter/sensor device, such as reflective or through-beam, including a conventional infrared emitter and sensor. For a reflective emitter/sensor device, the emitter and sensor are both mounted on the same side of the substrate, instead of on opposite sides as shown in FIG. 4. The output from the sensors 402–404 is applied as input to controller 133 for use in computing the center coordinates of the substrate 140 as the substrate 140 moves through the mini-environment 120, as will be described below.

The emitters 410–412 and their associated sensors 402–404 are aligned so that the sensors 402–404 intercept sensor beams 418–420 from the associated emitters 410–412. The emitters 410–412 and sensors 402–404 do not have to be arranged in any particular manner with respect to each other. Rather, the emitters 410–412 and sensors 402–404 may be located in any convenient space within the mini-environment 120. All that is required for the locations of the emitters 410–412 and sensors 402–404 is that their sensor beams 418–420 cross through the anticipated path of the substrates 140. It is not necessary for the emitters 410–412 and sensors 402–404 to be arranged in a single straight line or even to be arranged with their sensor beams 418–420 parallel to each other. However, it is preferable that the sensor beams 418–420 be collinear with the z-axis, since otherwise, the position of the substrate may have to be precisely controlled.

Figures 5, 6:
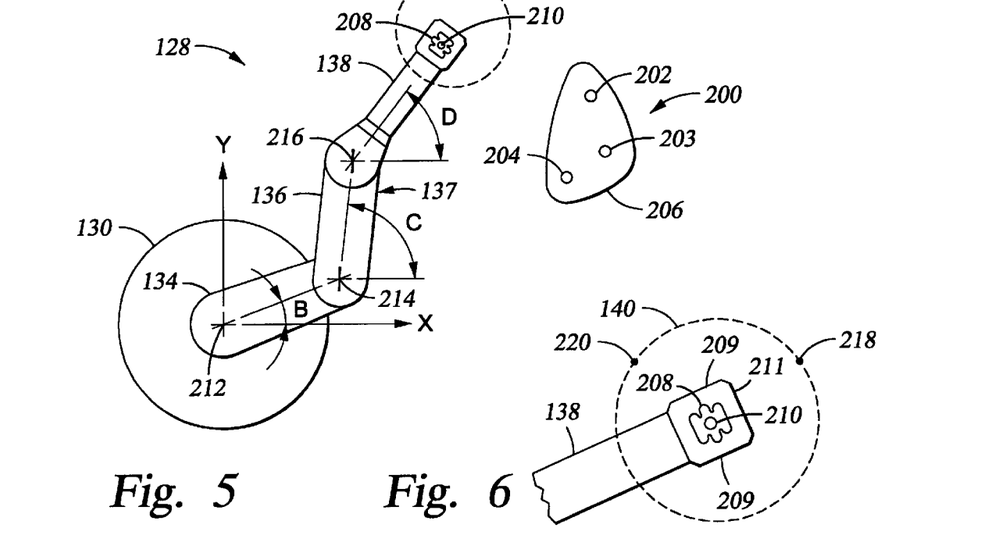
FIG. 5 is a top view of a substrate handler and sensors for finding the center of a substrate.
FIG. 6 is a top view of a tip of a substrate handler arm assembly and a substrate.

FIG. 5 shows a substrate handler 128 with a substrate 140 and a bank 200 of sensor units 202–204, representing, for example, emitter/sensor pairs. The sensor beams from the sensor units 202–204 intersect the path of the substrate 140. The sensor units 202–204 are held by a support 206 to a suitable brace in the mini-environment 120. As described above, the sensor units 202–204 may be located anywhere, even randomly, within the mini-environment 120 where a substrate can intersect the sensor beams. However, the preferred location for the sensors 202–204 is in an anticipated path of a substrate from the pod loaders 122 to the load lock chambers 118, so that the center-finding can be done without substantially altering the trajectory of the substrate.

The substrate handler 128 has an encoder for determining the pivot angles, or joint positions, B, C, D of each of the arm links 134, 136, 138, relative to an x-axis direction. The substrate handler encoder is connected to the controller 133 (FIG. 3) to send signals indicating the joint positions. In the preferred embodiment, the controller 133 computes angle D based on angles B and C, as shown below, because the end effector 138 is always pointed radially from the center pivot point 212 of the arm assembly 137, so the relationship of angle D to angles B and C is known. Thus, the encoder typically determines only two angles. Since the end effector 138 is at the end of several tolerances, however, certain applications of the center-finding system may require an independent determination of the angle D of the end effector 138 from the encoder.

The end effector, or blade, 138 has a suction holder 208 for holding the substrate 140 with a suction grip while transferring the substrate 140. The end effector 138 also has a small hole 210, referred to hereinafter as the reference point, used to determine the location of the sensors 202–204 and the center of the substrate 140. The location of the reference point 210 is calculated with a coordinate system relative to the base 130 of the substrate handler 128. In other words, the pivot point 212 of the first arm 134 forms the origin for an x-y coordinate system for determining the location of the reference point 210. The location of the reference point 210 is calculated from the lengths of each of the arm links 134, 136, 138 and the joint positions B, C, D. Thus, the x-y coordinates for the reference point 210 are given by the forward kinematic equations of the substrate handler 128 as follows:

$$x_{210} = L_1 \cos B + L_2 \cos C + L_3 \cos D, \text{ and}$$

$$Y_{210} = L_1 \sin B + L_2 \sin C + L_3 \sin D,$$

where $L_1$ is the length of the first arm 134 from its pivot point 212 to the pivot point 214 of the middle arm 136, $L_2$ is the length of the middle arm 136 from its pivot point 214 to the pivot point 216 of the end effector 138, $L_3$ is the length of the end effector 138 from its pivot point 216 to its reference point 210, angle B is the angle of the first arm 134 with respect to the x-axis, angle C is the angle of the middle arm 136 with respect to the x-axis, and angle D is the angle of the end effector 138 with respect to the x-axis. Since the end effector 138 is known to be in a radial direction from the point 212, D may be expressed as:

$$D = \tan^{-1}\left(\frac{y_{216}}{x_{216}}\right),$$

where:

$$x_{216} = L_1 \cos B + L_2 \cos C, \text{ and}$$

$$Y_{216} = L_1 \sin B + L_2 \sin C.$$

In another embodiment, if the base 130 of the substrate handler 128 is to be moving while the center-finding is performed, then the location of the base 130 on its track in the mini-environment 120 may have to be accounted for as well.

The locations of the sensor units 202–204 are calibrated by moving the reference point 210 until it coincides with the sensor beam for each of the sensor units 202–204. The reference point 210 can be aligned with a sensor beam by running on the controller 133 a suitable homing procedure that moves the reference point 210 nearer and nearer to the sensor beam.

A suitable homing procedure may perform a rough location of the reference point 210 by using an approximate location for the sensor stored in the homing procedure and moving the tip, or radial, edge 211 (FIG. 6) directly to the sensor and locating the radial edge 211 when it triggers the sensor. Once the location of the radial edge 211 is known, the homing procedure moves the end effector 138 in either tangential direction until one of the side edges 209 triggers the sensor. In the preferred embodiment, the edges 209, 211 generally form a square and the approximate distance from the edges 209, 211 to the reference point 210 is known, so a calculation for the rough location of the reference point 210 may be performed, and the reference point 210 may be moved to this location. Afterward, fine tuning of the location of the sensor may be performed by moving the reference point 210 until the intensity of the signal from the relevant sensor unit 202–204 is a maximum, above a threshold or high enough to trigger the output signal. Alternatively, the reference point 210 may be initially located by using default values for the reference point 210 stored in the homing procedure, followed by fine-tuning as described above. The fine tuning of the location of the reference point 210 in a sensor beam generally locates the sensor beam with a precision of about 3 to about 5 mils.

When the controller 133, operating under the homing procedure, has located the reference point 210 in the sensor beam of a sensor unit 202–204, the controller 133 records the positional data from the encoder, performs the above calculations to determine the x-y coordinates of the reference point 210 and assigns those coordinates to the associated sensor unit 202–204. The homing procedure is repeated for each sensor unit 202–204 until x-y coordinates for all of the sensor units 202–204 are determined. The coordinates are defined as points $(x_1,y_1)$, $(x_2,y_2)$ and $(x_3,y_3)$.

When the system 100 is in operation, the substrate handler 128 moves the substrate 140 in any path, or trajectory, through each of the sensor beams. The path may be linear, circular or irregular. The substrate handler 128 may even move the substrate 140 in a path that zigzags, stops and reverses. However, to avoid hysteresis effects, it is preferred to always pass through a sensor beam in the same direction and at the same speed. As the substrate 140 moves through its path, the substrate 140 will trigger each sensor unit 202–204, first, on its leading edge when it crosses through and interferes with the sensor beam and, second, on its trailing edge when it passes out of and stops interfering with the sensor beam. Each time a sensor is triggered, the controller 133 receives a trigger signal from the sensor and records the positional data from the encoder. From the recorded positional data, the controller 133 calculates the coordinates of the point on the substrate edge where the substrate 140 triggered the sensor according to the equations above. In this manner, each sensor 202–204 will typically generate two substrate edge data points.

FIG. 6 shows an end effector 138 with a reference point 210 and two substrate edge data points 218, 220 on a substrate 140. When the substrate 140 triggers the sensor beam at point 218, the controller 133 records the x-y coordinates of the reference point 210 as $(x_{r1}, y_{r1})$; and when the substrate 140 triggers the sensor beam at point 220, the controller 133 records the x-y coordinates of the reference point 210 as $(x_{r2}, y_{r2})$. The coordinates of points 218, 220 are calculated with reference to the reference point 210 based on the calibrated coordinates of the sensors 202–204. In other words, the reference point 210 serves as the origin for a new coordinate system. For example, if both points 218, 220 are triggered by the sensor 202, then the x-y coordinates for the two points 218, 220 are given as $(x_1-x_{r1}, y_1-y_{r1})$ and $(x_1-x_{r2}, y_1-y_{r2})$, respectively.

Figure 7:
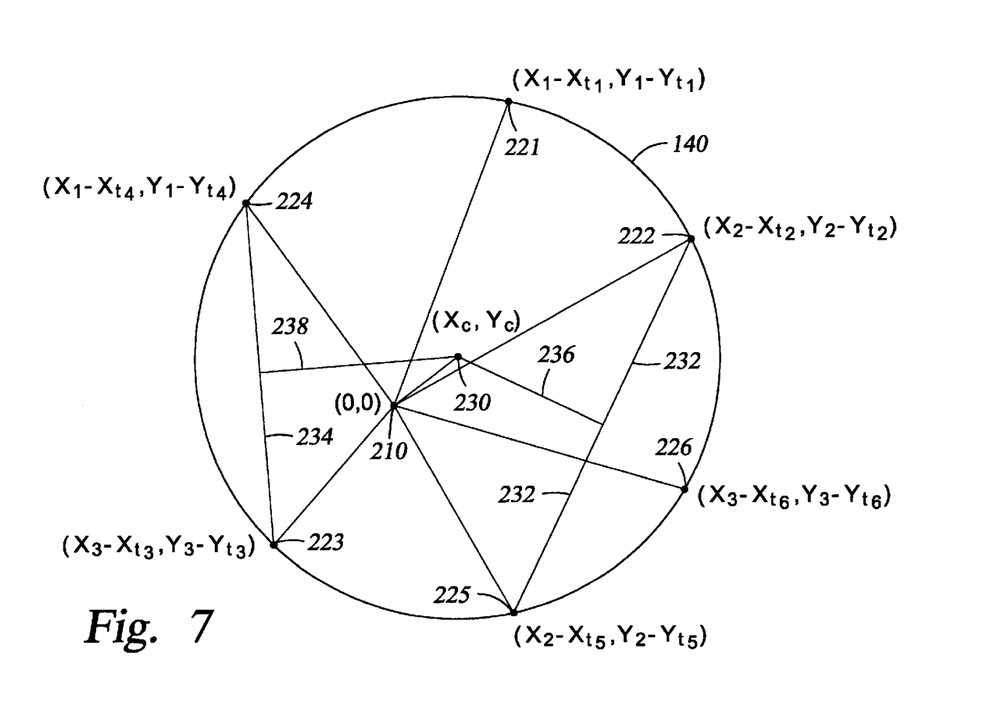
FIG. 7 is a top schematic view of a substrate and the points used to calculate the center of the substrate.

FIG. 7 shows a substrate 140 with six substrate data points 221–226 with x-y coordinates given relative to the reference point 210. In this example, there are three sensors, each triggering at two points. The first sensor triggers at points 221, 224; the second sensor triggers at points 222, 225; and the third sensor triggers at points 223, 226. If the data points 221–226 are connected with straight lines connecting data point pairs, then these lines would not be parallel, indicating that the substrate 140 did not move in a straight or uniform path through the sensors. Since the substrate 140 is generally circular, however, the six data points 221–226 define a circle. The center 230 of the circle, and hence the center of the substrate 140, can be calculated from an appropriate formula. The substrate center coordinates relative to the reference point 210, or the substrate center offset, are $(x_c, y_c)$. Thus, in order to account for the offset and correct the location of the substrate center, the reference point location must be adjusted by $(-x_c, -y_c)$ throughout its trajectory.

The above embodiment assumes that the six data points 221–226 are generated by three sensors 202–204. However, since three data points on a circle will define the circle, this embodiment provides three extra data points. An alternative embodiment may use only two sensors and provide only one extra data point, thus saving the cost of a third sensor. However, in order to reduce the effect of irregularities in the edge of a substrate, the extra data points are useful either to calculate an average for the center point 230 or to eliminate some of the data points that can be determined to be off the circle, and thus unreliable or invalid. In fact, most substrates 140 are not entirely circular. Rather, substrates typically have a notch or one or two straight edges, called substrate flats, for use when orienting the substrate in a particular direction with a substrate aligner. Additionally, some data points may be off the circle due to unknown chips or defects in the edge of the substrate. Furthermore, a substrate typically has about a 20 mil tolerance in its radius, so the radius is expected to vary by ±20 mil even for a defect-free substrate.

Formulas for calculating the center of a circle from points on the circle are generally known. One such formula uses the general equation for a circle:

10 $(X-X_c)^2+(y-y_c)^2=R^2$, where $x_c$ and $y_c$ are the unknown center of the circle, and R is the unknown radius. Thus, with three unknowns, any three points will generate three equations, which can be solved simultaneously to determine the center and the radius. In order to reduce the effect of unreliable data points, a center and radius may be calculated for every possible combination of three data points, and an average center may be calculated. Alternatively, the calculated center for each set of three data points that does not provide a calculated radius close enough to the expected radius may be discarded as unreliable, due to a notch, substrate flat or defect. Then only the remaining centers are used to calculate a final average center.

An alternative formula for calculating the center of the circle can determine the best fit circle. Such formulas determine the best values for $x_c$, $y_c$ and R which minimize the error between the circle and the data points.

Another formula for calculating the center of a circle from points on the circle takes any two chords, such as chords 232 and 234, that connect any two data points, calculates the perpendicular bisectors 236, 238, and calculates the intersection of the perpendicular bisectors. This intersection would be the center 230 of the substrate 140 if the substrate 140 were a perfect circle. In order to reduce or eliminate the effects of unreliable data points, the distances from the center 230 to the data points of the chords are calculated, and if any of these distances is not within an acceptable tolerance of the radius of the substrate 140, then this center may be discarded as invalid or unreliable. Using only the valid centers from every possible set of two chords generated by every possible combination of data points, an average center may be calculated to give the final center coordinates $(x_c, y_c)$.

Another embodiment may use as many or as few sensors as are available or affordable, even just one sensor, and have the substrate pass through the same sensor more than once at different positions. In this manner, the desired number of data points can be generated with any number of sensors. However, the substrate path for this embodiment may be very irregular and long, thereby slowing down the transfer time of the substrates.

In the operation of the preferred embodiment, the substrate handler 128 removes a substrate 156 from a pod 154 on one of the pod loaders 122. The substrate handler 128 may transfer the substrate to a substrate aligner prior to placing the substrate into a load lock chamber 118, or the substrate handler 128 may transfer the substrate directly to the load lock chamber 118. Whether the substrate is transferred directly to the load lock chamber 118 or goes first to a substrate aligner, the substrate needs to be centered before it is placed in either location. For example, the substrate needs to be centered before being placed in a slot in the load lock chamber 118, so that all subsequent manipulations of the substrate will be done knowing that the substrate is already correctly centered. Alternatively, the substrate needs to be centered before being placed in the substrate aligner, so that the alignment may be done more quickly, because otherwise, the substrate aligner will have to center the substrate. Thus, in the preferred embodiment, the substrate needs to be centered before the substrate handler 128 releases it.

Preferably, the substrate is moved in the path that takes the least amount of time, so that the throughput of the system 100 may be enhanced. This path, however, may not be a clearly defined straight or circular line. Rather, the substrate may have its speed and direction optimized with the result that the substrate takes an irregular path from the pod loader 122 to its destination. This path will have been predetermined, so the desired number of sensors may be located in the expected path at whatever locations are convenient and provide data points approximately at desired locations on the substrate edge.

As the substrate passes through the sensors, it triggers the sensors at its leading and trailing edges. The position of the encoder in the substrate handler 128 is recorded each time that a sensor is triggered. The recorded data is converted by the controller into x-y coordinates for each data point, and the substrate center is calculated. While the substrate is still moving, the location of the reference point 210 is adjusted to account for any offset in the substrate center. This center-finding and correcting is performed by the controller without slowing down the movement of the substrate to its destination.

An advantage of the above described center-finding method and apparatus is that the center-finding system is very flexible. The positioning of the sensors can be tailored to the most preferred path for the substrate, rather than requiring the substrate to follow a path dictated by the placement of the sensors. Additionally, the sensors may be located where they take advantage of existing supports or take account of existing obstacles in the mini-environment 120, or any other chamber in which the center-finding is performed, rather than requiring a particular placement or alignment. Furthermore, the sensors and beam emitters do not have to be perfectly aligned, since the calibration procedure determines the coordinates where the substrate will trigger the sensors.

Another advantage is that the locations of the sensors don't always have to be changed when the size of the substrate changes, since the method can operate with data points at any locations on the substrate edge. If the locations of the sensors, however, turn out to provide poor results, and if it is inconvenient or impossible to change the locations of the sensors, then the system operator can simply change the trajectory of the substrate to provide more desirable data points.

THE SYSTEM

Referring back to FIG. 2, an exemplary vacuum processing system 100 incorporating the above center-finding system will now be described in detail. The process chambers 114 perform the substrate process on the substrates in the vacuum processing system 100. The process chambers 114 may be any type of process chamber, such as a rapid thermal processing chamber, a physical vapor deposition chamber, a chemical vapor deposition chamber, an etch chamber, etc. The process chambers 114 may be supported by the transfer chamber 112 or may be supported on their own platforms depending on the configuration of the individual process chambers 114. Slit valves (not shown) in the facets 113 provide access for the substrate handler 116 and isolation between the transfer chamber 112 and the process chambers 114. Correspondingly, the process chambers 114 have openings (not shown) on their surfaces that align with the slit valves.

The load lock chambers 118 support the substrates 150 on a set of substrate supports and transition the substrates 150 between the ambient environment pressure to the transfer chamber vacuum pressure. Openings (not shown) in facets 115 provide access and valves provide isolation between the load lock chambers 118 and the transfer chamber 112. Correspondingly, the load lock chambers 118 have openings on their surfaces that align with the openings in the facets 115. The load lock chambers 118 and the mini-environment 120 have corresponding openings (not shown) providing access therebetween, while doors (not shown) for the openings provide isolation.

The mini-environment 120 has four pod loaders 122 attached on its front side. Openings (not shown) with corresponding doors 123 provide access and isolation between the mini-environment 120 and the pod loaders 122. The pod loaders 122 are mounted on the side of the mini-environment 120 and are essentially shelves for supporting the substrates 156 in their pods 154, which are used to transport the substrates 156 to and from the vacuum processing system 100.

The substrate handler 128 is disposed within the mini-environment 120 for transferring the substrates between the pod loaders 122 and the load lock chambers 118. The substrate handler 128 is typically mounted on a track so the substrate handler 128 can move back and forth in the mini-environment 120. Although the present invention has been described with reference to the mini-environment substrate handler 128, it is understood that the invention is not so limited, but can be used with the transfer chamber substrate handler 116 and other types of substrate handlers known in the industry.

In operation, a pod 154 containing substrates 156 to be processed in the processing system 100 is loaded onto one of the pod loaders 122. The door 123 to the pod loaders 122 is opened and the substrate handler 128 moves the substrates 156 from the pod 154, through the mini-environment 120 and into one of the load lock chambers 118 until the load lock chamber is full of substrates 150. During each substrate movement, the substrate triggers the center-finding system, so the controller can calculate the center of the substrate and correct the position of the substrate before the substrate reaches the load lock chamber 118. The load lock chamber 118 transitions the substrates 150 to the vacuum level of the transfer chamber 112. The transfer chamber substrate handler 116 transfers the substrates to one or more process chambers 114, so the process chambers 114 can process each substrate 117. In an alternative embodiment, the center-finding procedure may be done in the transfer chamber 112 while the substrate is moved therethrough. After processing, the substrate handler 116 transfers the substrate 117 from the process chamber 114 to the load lock chamber 118. After the load lock chamber 118 returns the substrate to the pressure level of the ambient environment, the mini-environment substrate handler 128 transfers the substrate to the pod 154. After the pod 154 is full of processed substrates, the pod 154 is removed and another pod 154 containing substrates 156 to be processed in the processing system 100 is loaded onto the pod loader 122. Periodically, the center-finding system performs the calibration routine to confirm the locations of the sensor units to prevent errors from creeping into the calculations.

While the foregoing is directed to the preferred embodiment of the present invention, other and further embodiments of the invention may be devised without departing from the basic scope thereof, and the scope thereof is determined by the claims which follow.

What is claimed is:

1. A method for handling a substrate in a processing system, comprising:

supporting the substrate on a substrate handler disposed in the processing system;

moving the substrate in a non-uniform path to trigger at least one sensor disposed in the processing system to determine at least three data points relative to a reference point of the substrate handler;

calculating a center of the substrate relative to the reference point utilizing the at least three data points; and moving the substrate to position the center of the substrate at a desired location in the processing system.

2. The method of claim 1 wherein the substrate is moved in a non-uniform path comprising one or more straight sections and one or more curved sections.

3. The method of claim 1 wherein:

the at least one sensor comprises at least one pair of sensor and emitter; and the data points are determined as the substrate starts interfering and stops interfering with a sensor beam between the emitter and sensor.

4. The method of claim 1, further comprising:

calibrating a position of at least one sensor disposed within the processing system.

5. The method of claim 4 wherein:

the position for the at least one sensor is calibrated by performing a homing procedure to align the reference point of the substrate handler with the at least one sensor.

6. The method of claim 1 wherein:

the at least one sensor consists of one sensor.

7. The method of claim 1 wherein:

the at least one sensor comprises at least one pair of beam emitter and beam sensor.

8. The method of claim 1 wherein:

the at least one sensor comprises three sensors disposed in a non-uniform arrangement.

9. A substrate center-finding apparatus for a substrate processing system having a substrate handler for moving a substrate, the substrate center-finding apparatus comprising:

at least one sensor disposed in the substrate processing system; and a controller connected to receive signals from the at least one sensor and to control the substrate handler, the controller configured to perform a substrate center-finding method comprising:

moving the substrate in a non-uniform path to trigger the at least one sensor;

determining at least three data points relative to a reference point of the substrate handler; and calculating a center of the substrate relative to the reference point.

10. The substrate center-finding apparatus of claim 9 wherein the the controller is further configured to calibrate a position for at least one sensor disposed within the processing system.

11. The substrate center-finding apparatus of claim 10 wherein the the substrate handler includes a robot blade having a calibration hole for calibrating the position of the sensor to the reference point.

12. The substrate center-finding apparatus of claim 9 wherein the at least one sensor comprises at least three sensors disposed in a non-uniform arrangement which intersects an anticipated path of the substrate.

13. The substrate center-finding apparatus of claim 9 wherein:

the controller is further configured to position the center of the substrate at a desired location in the processing system.

14. An apparatus for transferring a substrate in a processing system having a robot and at least on sensor disposed in the processing system, comprising:

a computer-readable medium containing instructions of a computer program for performing a method comprising:

moving the substrate in a non-uniform path to trigger the at least one sensor disposed in the processing system;

determining at least three data points in relation to a reference point, each data point representing coordinates of a point on a substrate perimeter as the at least one sensor is triggered;

determining a center of the substrate in relation to the reference point utilizing the at least three data points; and moving the substrate to position the center of the substrate in a desired location in the processing system.

15. The apparatus of claim 14, wherein the method further comprises calibrating a position for the at least one sensor disposed in the processing system.

16. The apparatus of claim 15, wherein the robot includes a robot blade having a calibration hole for calibrating the position of the at least one sensor to the reference point.

17. The apparatus of claim 14, wherein the at least one sensor comprises at least three sensors disposed in a non-uniform arrangement which intersects an anticipated path of the substrate.

18. The apparatus of claim 14, wherein the method further comprises positioning the center of the substrate at a desired location in the processing system.

* * * * *

UNITED STATES PATENT AND TRADEMARK OFFICE
CERTIFICATE OF CORRECTION

PATENT NO. : 6,198,976 B1
DATED : March 6, 2001
INVENTOR(S) : Sundar et al.

It is certified that error appears in the above-identified patent and that said Letters Patent is hereby corrected as shown below:

<u>Column 10,</u>
Line 24, please delete " 10".

<u>Column 14,</u>
Line 12, please replace " the the" with -- the --.
Line 18, please replace " the the" with -- the --.

Signed and Sealed this

Ninth Day of April, 2002

*Attest:*

*Attesting Officer*

JAMES E. ROGAN
*Director of the United States Patent and Trademark Office*